United States Patent [19]
Guiberson et al.

[11] Patent Number: 6,088,029
[45] Date of Patent: Jul. 11, 2000

[54] ENHANCED DISPLAY OF A CONTROL WINDOW IN A MEASUREMENT INSTRUMENT

[75] Inventors: Kelcie Guiberson, Portland; Wendell W. Damm, Beaverton; Steven M. Mishler, Hillsboro, all of Oreg.

[73] Assignee: Tektronix, Inc., Beaverton, Oreg.

[21] Appl. No.: 09/106,048

[22] Filed: Jun. 26, 1998

[51] Int. Cl.[7] .................................................. G06F 15/00
[52] U.S. Cl. ............................ 345/347; 345/134; 702/68
[58] Field of Search ...................... 345/340, 339, 345/341, 348, 349, 342, 347, 345, 134–302, 327, 328; 702/66, 67, 68, 69, 70, 71, 72, 73, 74

[56] References Cited

U.S. PATENT DOCUMENTS

| | | | |
|---|---|---|---|
| 5,325,481 | 6/1994 | Hunt | 345/347 |
| 5,579,462 | 11/1996 | Barber et al. | 345/140 |
| 5,661,816 | 8/1997 | Fantone et al. | 382/100 |
| 5,812,506 | 9/1998 | Pietrzykoski et al. | 369/54 |
| 5,896,131 | 4/1999 | Alexander | 345/340 |
| 5,930,737 | 7/1999 | Banjo | 702/127 |
| 5,953,009 | 9/1999 | Alexander | 345/348 |
| 5,956,013 | 9/1999 | Raj et al. | 345/134 |

*Primary Examiner*—Ba Huynh
*Attorney, Agent, or Firm*—Allan T. Sponseller; Thomas F. Lenihan

[57] ABSTRACT

A real-time data display in a control window of a measurement instrument receives real-time data corresponding to an application, wherein the real-time data is to be displayed to a user. A control window is also displayed, including one or more user-selectable options within the control window and at least a portion of the real-time data within a portion of the control window. A user selection of an option to alter a display of the real-time data is then received, and the real-time data being displayed is altered within the portion of the control window in accordance with the user-selected option.

20 Claims, 4 Drawing Sheets

ENHANCED DISPLAY OF A CONTROL WINDOW IN A MEASUREMENT INSTRUMENT

BACKGROUND OF THE INVENTION

1. Field of the Invention

The present invention pertains to measurement instruments. More particularly, this invention relates to real-time data display in a control window of a measurement instrument.

2. Background

Various measurement instruments including oscilloscopes are known in the art. Measurement instruments are used in a wide variety of applications, such as measuring engine vibrations, measuring electronic device voltages, measuring brain waves, etc. Historically, measurement instruments are analog devices, however, increasingly measurement systems are constituted with digital components. Furthermore, increasingly graphical user interfaces (GlTIs) are being employed to assist users in control and operation of the instruments.

One way to provide user-control of a measurement instrument which uses a GUI is to provide user-selectable options through a dialog box. A dialog box is, generally, an additional "control" window corresponding to a particular one or more software applications, the purpose of which is to provide user-selectable control options. Such options can be "button" or "hot-spot" selectable areas, menu items, check boxes, command line input areas, etc. However, dialog boxes often cover up a large portion of the measurement instrument's display device, which are typically relatively small, thereby preventing a user from seeing his or her data in the underlying application. This covering up of data by dialog boxes is particularly troublesome with measurement instruments because these instruments typically provide real-time data to the user, and it is the parameters that control the acquisition of that real-time data that are being adjusted through the dialog box.

Thus, an improved dialog box interface for measurement instruments is needed. As will be discussed in more detail below, the present invention achieves these and other desirable results.

SUMMARY OF THE INVENTION

A real-time data display in a control window of a measurement instrument is described herein. Real-time data corresponding to an application is received, wherein the real-time data is to be displayed to a user. A control window is also displayed, including one or more user-selectable options within the control window and at least a portion of the real-time data within a portion of the control window. A user selection of an option to alter the acquisition of the real-time data is then received, and the real-time data being displayed is altered within the portion of the control window in accordance with the user-selected option.

According to one embodiment of the present invention, the control window is a dialog box.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined, and otherwise manipulated through mechanical and electrical components of the computer system; and the term computer system includes general purpose as well as special purpose data processing machines, systems, and the like, that are standalone, adjunct or embedded.

Various operations will be described as multiple discrete steps in turn in a manner that is most helpful in understanding the present invention, however, the order of description should not be construed as to imply that these operations are necessarily order dependent, in particular, the order of their presentations.

The present invention is described herein with reference to the display of dialog boxes. It is to be appreciated that this is merely one embodiment of the present invention and that alternate embodiments apply to other types of "control" windows that allow programmable features to be altered by a user. According to one such alternate embodiment the enhanced display of the present invention is used within help windows or boxes.

Figure 1:
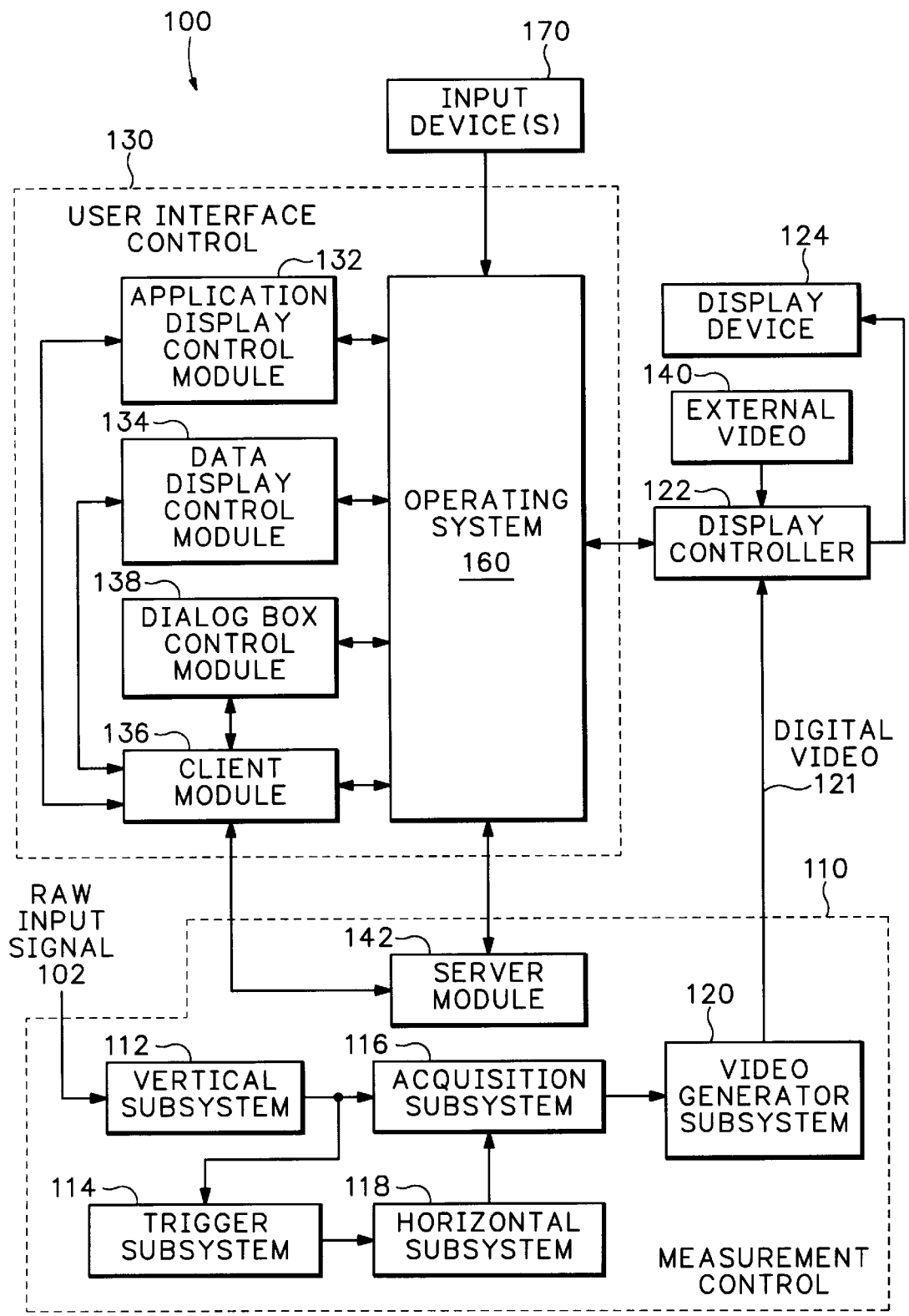
FIG. 1 is a block diagram illustrating a measurement instrument according to one embodiment of the present invention.

FIG. 1 is a block diagram illustrating a measurement instrument according to one embodiment of the present invention. In the discussions to follow, reference is made to the measurement instrument being an oscilloscope. However, it is to be appreciated that an oscilloscope is merely one measurement instrument which can be used with the present invention, and that any of a wide variety of measurement instruments that display data to a user via a display device can be used with the present invention.

FIG. 1 illustrates a measurement instrument 100 including a measurement control 110 and a user interface control 130. Measurement control 110 includes a vertical subsystem 112, trigger subsystem 114, acquisition subsystem 116, horizontal subsystem 118, and video generation subsystem 120. Input signals 102 are provided to measurement instrument 100 at measurement control 10. Subsystems 112–120 are intended to represent a broad category of these elements known in the art. Each of elements 112–120 performs its conventional functions, and the elements' constitutions are known. Accordingly, elements 112–120 will not be further described except as they pertain to the present invention.

Display controller 122 controls the display of video and graphics on display device 124. Graphics data from operating system 160 is written into a frame buffer (not shown) in or corresponding to display controller 122. Additionally, measurement control 110 provides a digital video output 121 to display controller 122. The digital video output 121 is scaled as necessary by controller 122 and displayed within a portion of the display device 124 as defined by either data display control module 134 or dialog box control module 138. Display controller 122 combines the graphics data from operating system 160 and the digital video output 121, allowing both to be displayed concurrently on display device 124. According to one embodiment, display device 124 is a 640×480 resolution LCD display. However, alternate embodiments of the present invention use different resolutions as well as different types of displays (e.g., a cathode-ray tube (CRT)). Additionally, according to one implementation display controller 122 is a video and graphics LCD/CRT controller model number CL-GD7556 available from Cirrus Logic of Fremont, Calif.

User interface control 130 provides a GUI which allows a user to interact with measurement instrument 100. Application display control module 132 provides control of an application window while data display control module 134 controls the definition of a data display area within the application window. The real-time data being received by measurement instrument 100 is displayed to users within this data display area. In the illustrated embodiment, user interface 130 is designed to operate with a GUI operating system 160, such as Windows™ 95, Windows™ 98, or Windows™ CE, available from Microsoft Corporation of Redmond, Wash. Digital video signal 121 is provided to display controller 122, which displays the real-time data represented by digital video signal 121 on display device 124 within the data display window of the application. The location and size of such window is provided to display controller 122 by display control module 134. In accordance with the present invention, the real-time data is scaled for display within a data display portion of a dialog box, as discussed in more detail below.

Application display control module 132 controls the display of an application window via operating system 160. Data display control module 134 controls the definition of the data display area (e.g., location and size) via operating system 160. The location of display device 124 where the data display area is to be displayed, as well as the size of the data display area, are provided to display controller 122 from data display control module 134 via operating system 160 using windowing services of the operating system.

One or more input devices 170 are also included as part of measurement instrument 100 to allow user input to operating system 160, and thus to allow a user to interact with user interface control 130. Examples of such input device(s) include alphanumeric keyboards and cursor control devices (e.g., mouse, trackball, trackpad, etc.). According to an alternate embodiment, display device 124 includes a conventional touch screen which allows a user to input selections to operating system 160 by simply touching particular areas of a screen of display device 124.

User interface control 130 also includes dialog box control module 138, which provides dialog box sizing information to display controller 122 via operating system 160, including the display location and size for a real-time data window within a dialog box. As discussed in more detail below, this real-time data window is an "empty" portion of the display used by display controller 122 to display the real-time data. No graphics data is provided by operating system 160 for this empty portion. Alternatively, any graphics data provided by operating system 160 for this empty portion is "overwritten" or ignored by display controller 122 in favor of the real-time data.

Additionally, user interface control 130 includes a client module 136. Client module 136 communicates with server module 142 of measurement control 110 which allows user selections and control changes input to user interface 130 to be provided to measurement control 110. Sever module 142 communicates user selections and control inputs received from client module 136 to the appropriate subsystem of measurement control 110.

Measurement control 110 maintains the current settings for the various programmable and user-changeable features (also referred to as "acquisition parameters") of subsystems 112–120. Such settings may be maintained in a centralized database accessible by subsystems 112–120, or alternatively may be maintained individually by the subsystems 112–120 in databases, registers, or the like. Examples of such user-changeable features include trigger levels, vertical scale adjustments, horzontal scale adjustments, etc. It is to be appreciated that the specific user-changeable features are dependent on the particular measurement instrument.

Figure 2:
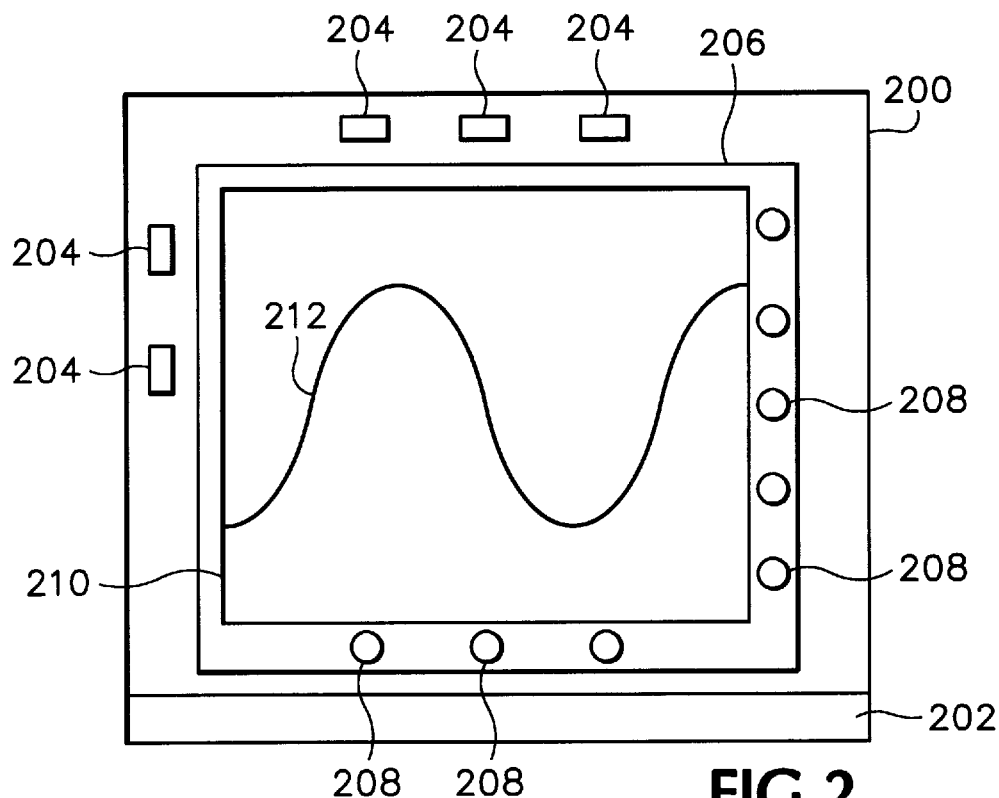
FIG. 2 illustrates an example user interface display according to one embodiment of the present invention.

FIG. 2 illustrates an example user interface display according to one embodiment of the present invention. As illustrated, a display 200 includes a menu bar 202 and multiple icons 204 provided by operating system 160 of FIG. 1. An application window 206 is also displayed, controlled by application display control module 132. Within application window 206 is display information 208 (such as status information of the settings of measurement control 110 of FIG. 1). A data display window 210 is also included within the application window 206, the definition of which is controlled by data display control module 134. The real-time data display 212 of the input signal 102 is displayed within data display window 210. As input signal 102 changes, so does real-time data display 212.

Additional video (external video 140, as well as other video information from operating system 160) may also be provided to display controller 122 for display on display device 124.

Figure 3:
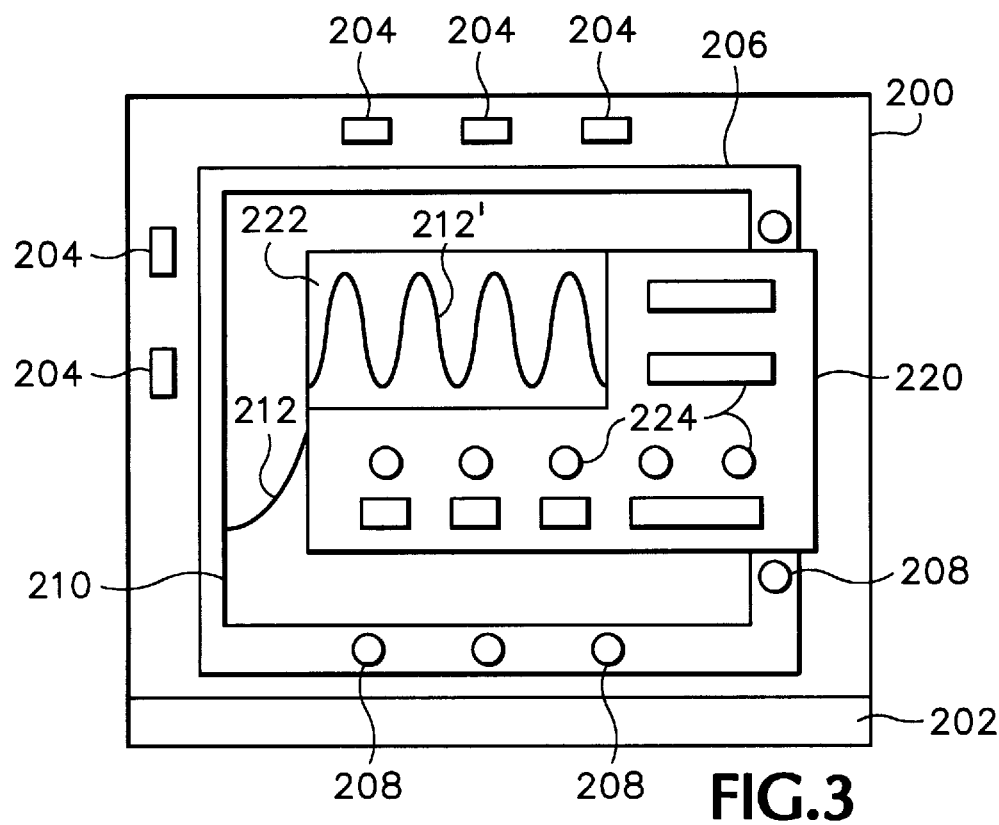
FIG. 3 illustrates an example user interface display including a dialog box with real-time data display according to one embodiment of the present invention.

FIG. 3 illustrates an example user interface display including a dialog box with real-time data display according to one embodiment of the present invention. As illustrated, a dialog box 220 is displayed in display 200 in addition to the application window 206 and data display window 210. Dialog box 220 provides various user-selectable options 224 to alter the display of digital video signal 121. These options 224 correspond to different settings of measurement control 110.

In the illustrated embodiment, the signal 212 being displayed is captured and "frozen" at the time dialog box 220 is opened. Thus, any changes to the digital video signal 121 as displayed in data display window 210 are not made until dialog box 220 is closed.

A portion 222 of dialog box 220 is used for the real-time data display. In one implementation, one-quarter of dialog box 220 is devoted to portion 222. However, in alternate implementations, a larger or smaller portion of dialog box is devoted to portion 222.

Upon selection of one of the options 224, an indication of the selection is provided to server module 142 of FIG. 1, which in turn changes the appropriate setting(s) of the measurement control register(s) or database(s). This causes measurement control 110 to change the digital video signal 121 in accordance with the selection. An altered digital video signal is then displayed as real-time data display 212' of FIG. 3. Thus, it can be seen that any changes to the subsystems 112–120 which alter the digital video signal 121 are displayed within portion 222 of dialog box 220.

Figure 4:
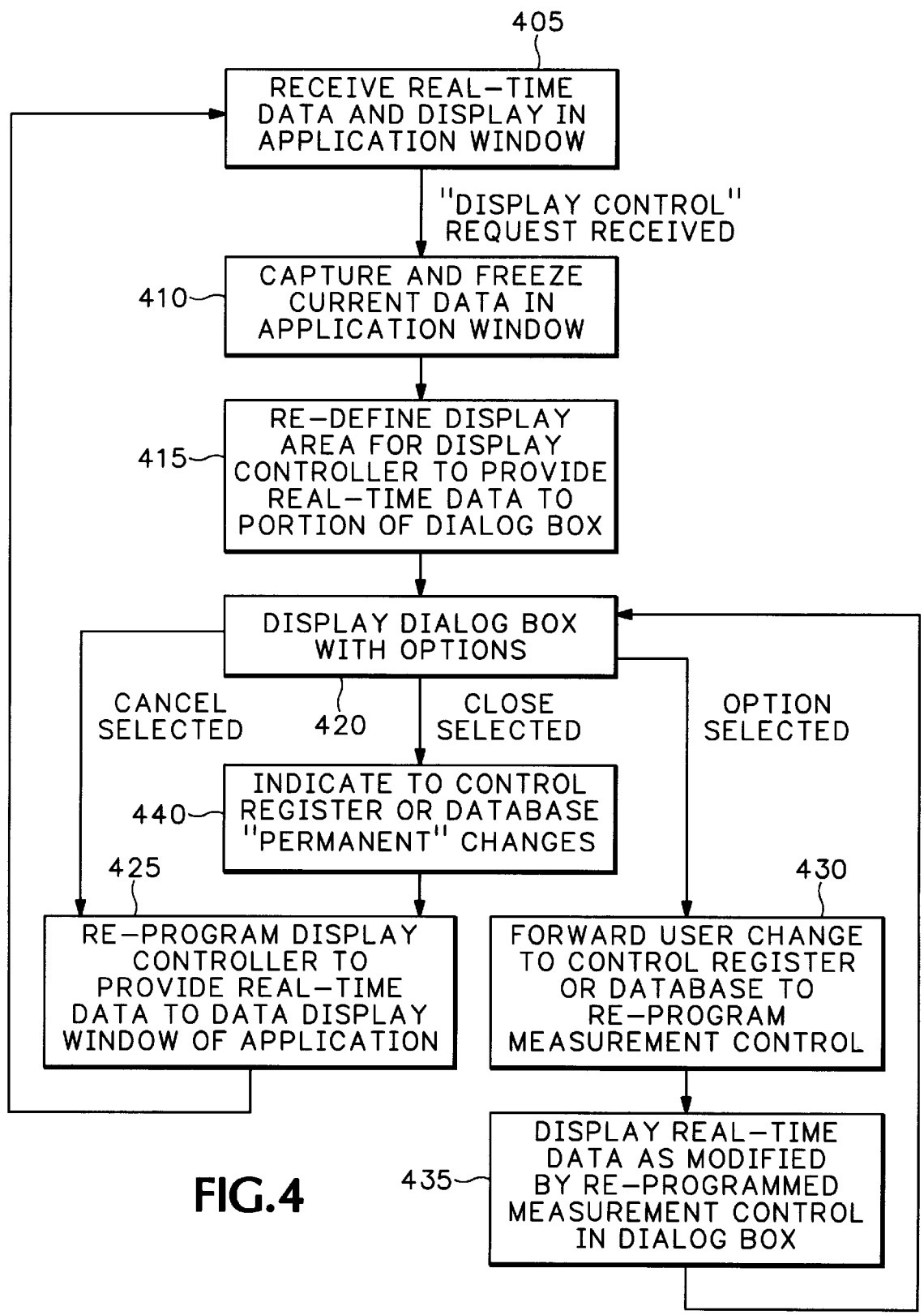
FIG. 4 is a flowchart illustrating the steps followed in providing real-time data display within a dialog box according to one embodiment of the present invention.

FIG. 4 is a flowchart illustrating the steps followed in providing real-time data display within a dialog box according to one embodiment of the present invention. Real-time data is received and displayed within the data display area of an application window, step 405. The display continues until a "display control" request is received. Such a request can be received in any of a wide variety of conventional manners, such as selection of a hot-button, selection of a menu item, a predefined key sequence, etc.

Upon receiving a "display control" request, application display control module 132 captures the current data being received as digital video signal 121, step 410. The data is captured from display controller 122 via operating system 160. This captured data is a "frozen" image of one data display area piece of the digital video signal 121 at a particular point in time. The captured data is then temporarily saved (e.g., as a bitmap) for provision to display controller 122 while the dialog box is opened. It is to be appreciated that in certain situations the dialog box could be positioned to fully "cover" the underlying window (e.g., data display window 210 of FIG. 2), thereby causing none of the captured data to be displayed.

Dialog box control module 138 then re-defines the display area for the display controller (via operating system 160) to provide real-time data to a portion of the dialog box, step 415. In the illustrated embodiment, dialog box control module 138 provides a new screen size and location corresponding to portion 222 of dialog box 220 to display controller 122. This size and location is then used by display controller 122 as the area for the real-time data display. Display controller 122 scales the received digital video signal 121 as necessary to fit within the portion 222. Dialog box control module 138 then generates a dialog box with one or more user-selectable options, step 420.

While the dialog box is being displayed, a user can select "cancel", "close", or one of the one or more user-selectable options for controlling measurement instrument 100. If "cancel" is selected, then dialog box control module 138 terminates the dialog box and re-defines the display area for display controller 122 to provide the real-time data display to the data display window of the application window, step 425. Any changes which were made by the user are dropped, and an indication is sent to the measurement control database(s) or register(s) that any temporary changes (discussed more below) should be ignored. Real-time data thus continues to be displayed in the data window of the application window, step 405.

If one of the user-selectable options for controlling measurement instrument 100 is selected, then the selection is used to re-program the measurement control database(s) or register(s) and thus alter the digital video signal generated by measurement control 110, step 430. The re-programming of measurement control database(s) or register(s) causes the real-time data, as modified by the selection, to be displayed in portion 222 of display box 220, step 435. The display controller remains re-defined and the dialog box remains open, step 420, allowing additional options to be selected. According to one implementation, measurement control database(s) or register(s) maintain a record that such changes are temporary until an indication is received to make the changes permanent.

If "close" is selected, then dialog box control module 138 indicates to the measurement control database(s) or register(s) that the entered user changes are "permanent", step 440. Dialog box control module 138 then terminates the display of the dialog box and re-defines the display area for display controller 122 to provide the real-time data to the data display window of the application window, step 425. Any changes made permanent in step 440 are thus incorporated into the display of the application window. Real-time data thus continues to be displayed in the data window of the application window, step 405.

Figure 5:
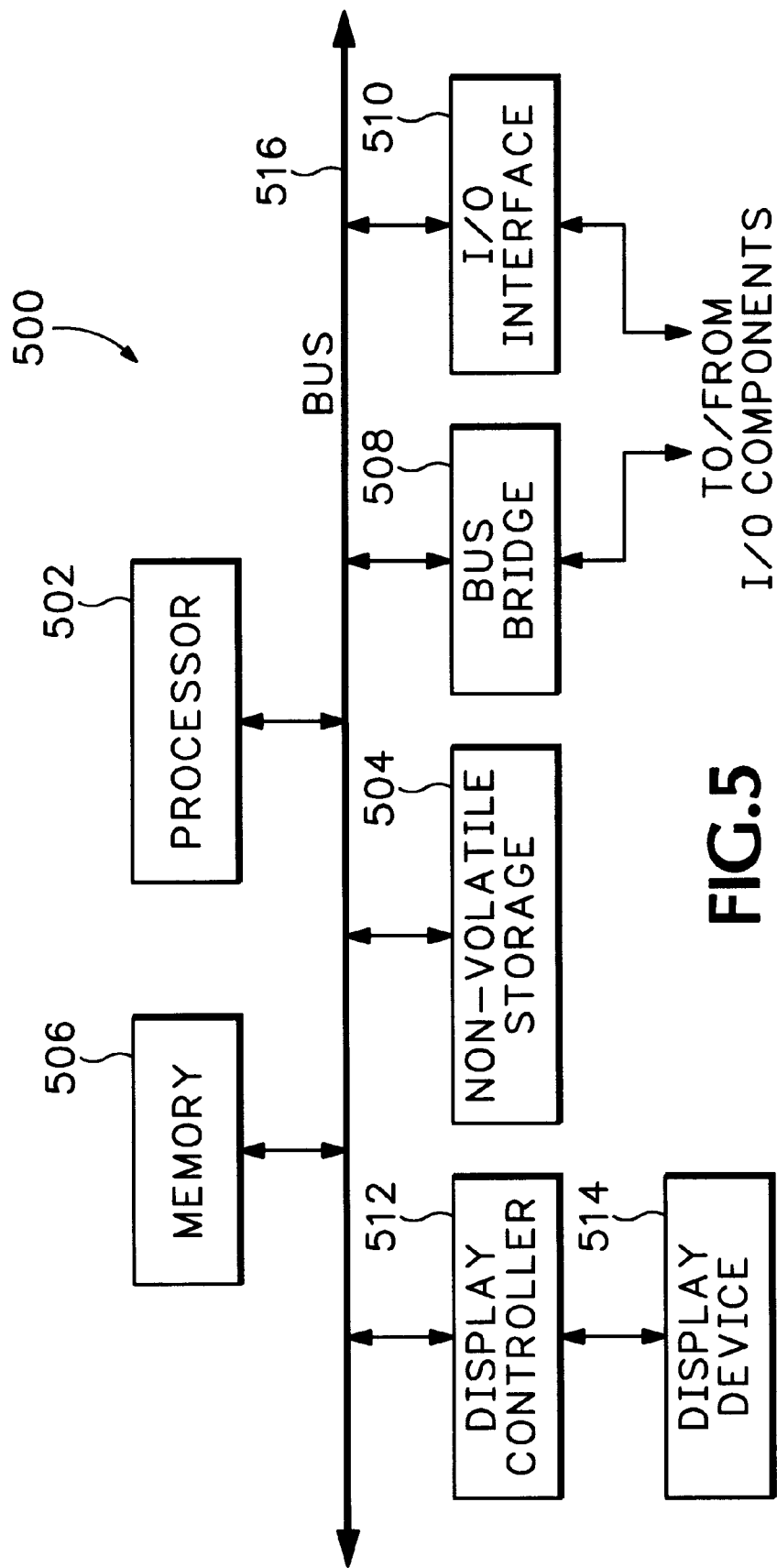
FIG. 5 illustrates a hardware system on which the user interface control of FIG. 1 can be implemented according to one embodiment of the present invention.

FIG. 5 illustrates a hardware system on which the user interface control 130 of FIG. 1 can be implemented according to one embodiment of the present invention. As illustrated, a system 500 includes a processor 502, non-volatile storage 504, memory 506, bus bridge 508, an input/output (I/O) interface 510, display controller 512, and display device 514, coupled to each other through internal bus 514. According to one implementation, display controller 512 is display controller 122 of FIG. 1, while display device 514 is display device 124 of FIG. 1. Bus bridge 508 is also coupled to measurement control 110 to facilitate provision of programming selections to and receipt of responses from measurement control 110. I/O interface 510 provides a coupling to various other I/O devices, such as other storage devices, cursor control devices, network connections, etc. In one embodiment, internal bus 514 is a peripheral component interconnect (PCI) bus, whereas bus bridge 508 is a PCI to PCI bridge. Elements 502–516 are all intended to represent a broad category of these elements known in the art. Each of the elements 502–516 performs its conventional functions known in the art, and their constitutions are well-known. Accordingly, elements 502–516 will not be discussed further.

In one embodiment, user interface control 130 and server module 142 discussed above are each implemented as a series of software routines run by the hardware system of FIG. 5. These software routines comprise a plurality or series of instructions to be executed by a processor in a hardware system. Initially, the series of instructions are stored on a storage device, such as non-volatile storage 504. The instructions are copied from non-volatile storage 504 into memory 506 and then accessed and executed by processor 502. In one implementation, these software routines are written in the C++ programming language. It is to be appreciated, however, that these routines may be implemented in any of a wide variety of programming languages. In alternate embodiments, the present invention is implemented in discrete hardware or firmware. By way of example, an application specific integrated circuit (ASIC) may be programmed to implement the functions of user interface control 130 discussed above.

Thus, the present invention provides an enhanced display of a control window, such as a dialog box, in a measurement instrument. Such display advantageously allows a user to see how selected options from within the control window will affect his or her actual data, regardless of how large the control window is or how much of other applications are covered by the control window.

In the discussions above, reference is made to the data in the underlying application being "frozen" while real-time data is being displayed in a portion of the dialog box. According to alternate embodiments, no data is displayed in the underlying application, or alternatively different (or additional) display controllers could be used to allow real-time data to be displayed concurrently in both the underlying application and the portion of the dialog box.

Also in the discussions above, reference is made to measurement control database(s) or register(s) maintaining a record of whether changes are "temporary" or "permanent". According to alternate embodiments, dialog box control module 138 maintains a record of which changes have been made and, if "cancel" is selected, module 138 forwards option changes to the measurement control database(s) or register(s) to undo each change which has been made.

Thus, an enhanced display of a control window in a measurement instrument has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims. 17

What is claimed is:

1. In a measurement instrument, a method comprising the steps of:
   receiving real-time data corresponding to an application, wherein the real-time data is waveform data to be displayed to a user in a first window displayed on a display screen;
   displaying a control window, including providing a user-selectable option within the control window, and providing at least a portion of the real-time data within a portion of the control window, said control window at least partially overlaying said first window and at least partially obscuring said real-time data displayed in said first window;
   receiving a user selection of an option to alter a display of the real-time data; and
   altering the display of the real-time data within the portion of the control window in accordance with the user-selected option.

2. The method of claim 1, wherein the step of displaying comprises the step of displaying a dialog box.

3. The method of claim 1, further comprising the steps of:
   receiving a request to display the control window;
   capturing a piece of the real-time data at approximately the same time as the request is received; and
   displaying the captured piece in a window of the application while the control window is being displayed.

4. The method of claim 1, wherein the step of altering comprises the step of:
   updating a measurement control logic to acquire the real-time data in accordance with the user-selected option.

5. The method of claim 1, further comprising the steps of:
   receiving a request to close the control window; and
   altering the display of the real-time data being displayed with the application in accordance with the user-selected option in response to receipt of the request.

6. The method of claim 1, wherein the step of displaying a control window including providing at least a portion of the real-time data within a portion of the control window comprises the step of re-defining a display area for a display controller to provide the real-time data within the portion of the control window.

7. An apparatus comprising:
   a measurement control to receive real-time data corresponding to an application, wherein the real-time data is waveform data to be displayed to a user;
   a display controller to provide signals representing the real-time data to a display device for display within a first window; and
   a control module to,
      provide a display of a control window including a user-selectable option and at least a portion of the real-time data within a portion of the control window, said control window at least partially overlaying said first window and at least partially obscuring said real-time data displayed in said first window;
      receive a user selection of an option to alter a display of the real-time data, and
      alter the display of the real-time data within the portion of the control window in accordance with the user-selected option.

8. The apparatus of claim 7, wherein the control window comprises a dialog box.

9. The apparatus of claim 7, further comprising a data display control module to:
   receive a request to display the control window;
   capture a piece of the real-time data at approximately the same time as the request is received; and
   display the captured piece in a window of the application while the control window is being displayed.

10. The apparatus of claim 7, wherein the control module is further operative to update the measurement control to acquire the real-time data in accordance with the user-selected option.

11. The apparatus of claim 7, wherein the control module is further operative to:
    receive a request to close the control window; and
    alter the display of the real-time data being displayed with the application in accordance with the user-selected option in response to receipt of the request.

12. The apparatus of claim 7, wherein the control module is further operative to re-define a display area for the display controller to provide the real-time data within the portion of the control window.

13. The apparatus of claim 7, wherein the apparatus comprises a measurement instrument.

14. An apparatus comprising:
    means for receiving real-time data corresponding to an application, wherein the real-time data is waveform data to be displayed to a user in a first window displayed on a display screen;
    means for displaying a control window, including means for providing a user-selectable option within the control window and means for providing at least a portion of the real-time data within a portion of the control window said control window at least partially overlaying said first window and at least partially obscuring said real-time data displayed in said first window;
    means for receiving a user selection of an option to alter a display of the real-time data; and
    means for altering the display of the real-time data within the portion of the control window in accordance with the user-selected option.

15. The apparatus of claim 14, wherein the control window comprises a dialog box.

16. The apparatus of claim 14, further comprising:

means for receiving a request to display the control window;

means for capturing a piece of the real-time data at approximately the same time as the request is received; and means for displaying the captured piece in a window of the application while the control window is being displayed.

17. The apparatus of claim 14, wherein the means for altering comprises:

means for updating a measurement to acquire the real-time data in accordance with the user-selected option.

18. The apparatus of claim 14, further comprising:

means for receiving a request to close the control window; and means for altering the display of the real-time data being displayed with the application in accordance with the user-selected option in response to receipt of the request.

19. The apparatus of claim 14, wherein the means for providing at least a portion of the real-time data within a portion of the control window comprises means for re-defining a display area for a display controller to provide the real-time data within the portion of the control window.

20. The apparatus of claim 14, wherein the apparatus comprises a measurement instrument.

* * * * *